United States Patent [19]

Imhauser

[11] Patent Number: 5,444,292
[45] Date of Patent: Aug. 22, 1995

[54] INTEGRATED THIN FILM APPROACH TO ACHIEVE HIGH BALLAST LEVELS FOR OVERLAY STRUCTURES

[75] Inventor: William P. Imhauser, Ambler, Pa.

[73] Assignee: SGS-Thomson Microelectronics, Inc., Carrollton, Tex.

[21] Appl. No.: 222,565

[22] Filed: Apr. 4, 1994

Related U.S. Application Data

[63] Continuation of Ser. No. 958,571, Oct. 8, 1992, abandoned.

[51] Int. Cl.6 .......................................... H01L 29/72
[52] U.S. Cl. ................................ 257/580; 257/577; 257/578; 257/579; 257/581; 257/582; 257/583
[58] Field of Search .............. 257/577, 578, 579, 580, 257/581, 582, 583

[56] References Cited

U.S. PATENT DOCUMENTS

| | | |
|---|---|---|
| 3,619,741 | 11/1971 | Morgan . |
| 4,231,059 | 10/1980 | Hower et al. . |
| 4,639,757 | 1/1987 | Shimizu ............................ 257/580 |
| 4,680,608 | 7/1987 | Tsuzuki et al. ..................... 357/36 |
| 4,762,804 | 8/1988 | Moors . |

OTHER PUBLICATIONS

D. R. Carley, *Power Transistor Design,* Radio Corporation of America, Components and Devices, Somerville, N.J. (Apr., 1967).

*Primary Examiner*—Rolf Hille
*Assistant Examiner*—Valencia Martin Wallace
*Attorney, Agent, or Firm*—Allan Ratner; Lisa K. Jorgenson; Richard K. Robinson

[57] ABSTRACT

The ballast resistance of a semiconductor device is increased without decreasing the figure of merit of the device. The semiconductor device includes an emitter feeder, a first contact coupled to the emitter feeder, a second contact, a resistive medium connected between the first contact and the second contact, an emitter, and a further resistive medium connected between the second contact and the emitter. The ballast resistance of the semiconductor device is increased without decreasing the figure of merit of the device by increasing the distance between the first contact and the second contact.

8 Claims, 6 Drawing Sheets

FIG. 1

B=BASE
EP=EMIT./P
EO=EMIT. OP.
P=POLYSILICON
C=CONTACT
M=METAL

B=BASE
EP=EMIT.-P-
EO=EMIT.OPE
P=POLYSILICON
C=CONTACT
M=METAL

INTEGRATED THIN FILM APPROACH TO ACHIEVE HIGH BALLAST LEVELS FOR OVERLAY STRUCTURES

This application is a continuation of application Ser. No. 07/958,571, filed Oct. 8, 1992, now abandoned.

FIELD OF THE INVENTION

The present invention relates to semiconductor devices, and more particularly to a semiconductor device which may include a high emitter ballast resistance while maintaining a high figure of merit (emitter periphery over base area).

BACKGROUND OF THE INVENTION

Figure 1:
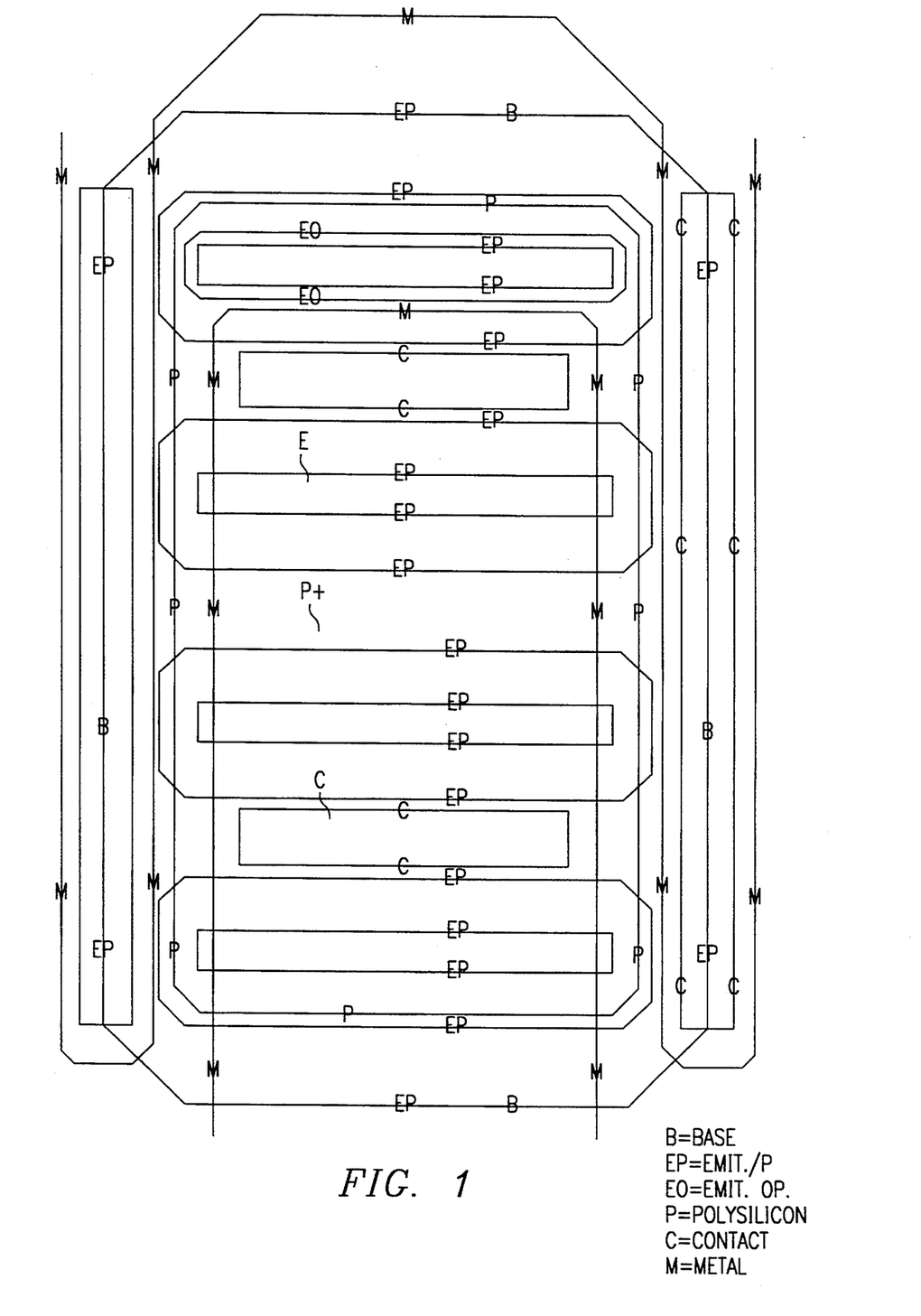
FIG. 1 is a top view of a standard overlay structure.

As illustrated by FIG. 1, an overlay structure typically includes an emitter stripe with a base contact situated outside of the emitter stripe on either side thereof. The base contacts are fed inwards into the middle of the emitter. On most overlay devices in general use, a polyconductor stripe covers the emitter and makes contact to the emitter. By offsetting this contact in a succeeding layer, a lateral ballasting effect is obtained. This offset may be obtained by placing a polyresistor layer between the contact and the polyresistor stripe. Current then flows through the contact, through the polyresistor layer, and into the emitter contact.

It is known in the semiconductor art that figures of merit may be used to describe the performance of a semiconductor device. One figure of merit of particular interest is defined as the numerical ratio between the emitter periphery (EP) and the base area (BA).

In a semiconductor device operating at high frequencies, low capacitance and hence high current handling capability is particularly desirable. Furthermore, high current handling capability results in high power capability. In order to design a high power, low capacitance device, the emitter periphery is increased as much as possible and the base area is decreased as much as possible. By increasing emitter periphery and decreasing base area, the figure of merit of the device is increased.

High-current handling transistors are subject to the phenomenon of second breakdown. Second breakdown occurs when, due to a non-uniform current distribution over the emitter zones ("current crowding") the temperature locally increases, as a result of which an avalanche effect is produced which leads to local current concentration and finally to destruction of the transistor.

In order to avoid this, the emitter zones are provided with emitter series resistors, also designated as ballast or stabilization resistors. These resistors ensure that a uniform distribution of the current over the various emitter zones is obtained due to the fact that upon increase of the current across an emitter zone the voltage drop across the series resistor connected thereto increases, as a result of which the current through this emitter zone decreases.

Various methods are known by which these emitter series resistors can be realized. For example, U.S. Pat. No. 3,896,475 discloses a well known method, according to which a common strip-shaped semiconductor resistance region of the same conductivity type as the base zone is used, which forms a pn junction with the collector region. The series resistor associated with a given emitter zone is then formed by the material of the resistance region present between the connection with the relevant emitter electrode and the connection with the connection conductor. By increasing the dimensions of the resistance region, the ballast resistance in turn is increased.

Although, it may be desirable to increase the ballast resistance of a device, increasing ballast resistance by increasing the dimensions of the resistance region may have undesirable effects. In particular, to increase the frequency handling capability of a device, the base dimensions may require minimization in order to increase the current handling capability of the device. This is accomplished by reducing the base area of the device to obtain a higher figure of merit. Unfortunately, this reduction results in inadequate room to include ballasting. In other words, by increasing the figure of merit, the maximum ballasting achievable is reduced. Conversely, by increasing the ballasting in a device, the figure of merit decreases.

SUMMARY OF THE INVENTION

A semiconductor device, including an emitter feeder, comprises a first contact coupled to the emitter feeder, a second contact, a resistive medium connected between the first contact and the second contact, an emitter, and a further resistive medium connected between the second contact and the emitter. The ballast resistance of the semiconductor device is increased without decreasing the figure of merit of the device by increasing the distance between the first contact and the second contact.

DESCRIPTION OF THE DRAWINGS

FIG. 14 is a cross sectional view of a portion of FIG. 15 taken in the plane X—X'.

DETAILED DESCRIPTION

An exemplary embodiment of the present invention will now be described more fully with reference to FIGS. 2–14, in which a semiconductor device is shown during successive stages of manufacture. FIGS. 3–14 show a side view of a relatively large portion of the semiconductor device. FIG. 15 shows a top view of the semiconductor device. These Figures are purely schematic and are not drawn to scale. In particular, the dimensions in the direction of thickness are comparatively strongly exaggerated for the sake of clarity.

Figure 2:
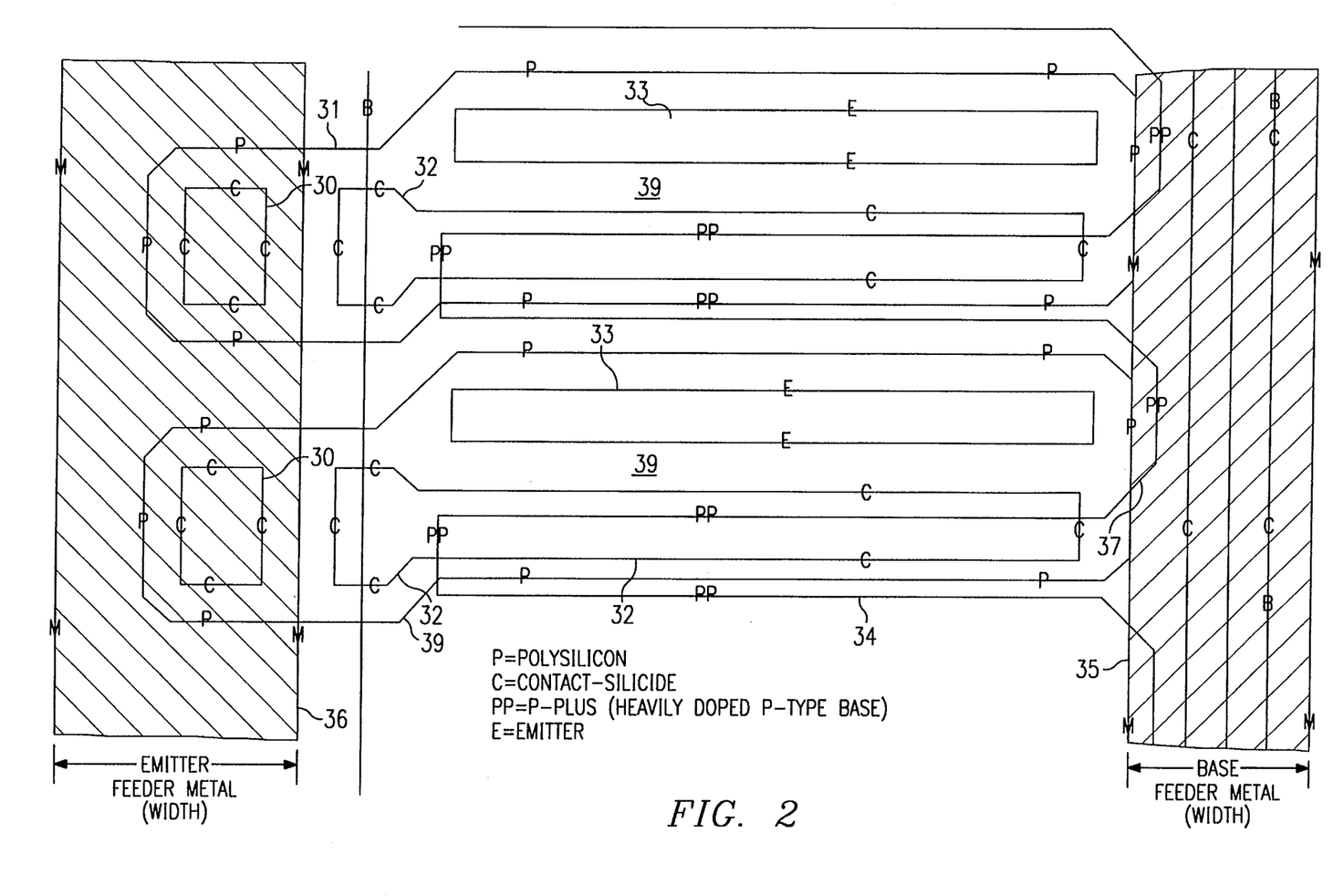
FIG. 2 is a top view of a semiconductor device in accordance with an exemplary embodiment of the present invention.

A semiconductor device in accordance with an exemplary embodiment of the present invention is illustrated in FIG. 2. Emitter feeder metal 36 is connected to contact 30. Contact 30 may be comprised of a material such as a silicide. Base feeder metal 35 is also shown. A further contact 32 (which may also be comprised of a silicide) is also shown. Contacts 30, 32 are typically a high conductivity silicide which may be comprised of any of several materials including platinum, titanium, etc. Each contact 30 is separated from a corresponding contact 32 by a polysilicon layer 39. Polysilicon layer 39 is a resistive medium. Emitter 33 is also included. Contact 32 is separated from Emitter 33 by polysilicon 39. Thus, contact 30, contact 32, emitter 33 and polysilicon 39 collectively may form a single semiconductor device.

Base diffusion layer 34 is shown positioned beneath polysilicon layer 39. Furthermore, emitter 33 is partially buried in base diffusion layer 34. Base diffusion layer 34 is coupled to base feeder metal 35.

Upon the receipt of current by contact 32, current flows from contact 32 to emitter 33 through polysilicon layer 39. In order to increase the ballast resistance of the semiconductor device formed by contact 32 and emitter 33, the distance between contact 32 and emitter 33 may be increased. Put another way, the ballast resistance may be increased by increasing the amount of polysilicon 39 which is found between contact 32 and emitter 33. Because polysilicon layer 39 is a resistor medium, an increase in the amount of polysilicon through which current must flow from contact 32 to reach emitter 33 will result in increased ballast resistance. Unfortunately, by increasing the distance between contact 32 and emitter 33, the figure of merit of this semiconductor device decreases due to the increased base area.

In order to increase the ballast resistance without decreasing the figure of merit, contact 30 is provided. In order for current to reach contact 32, current which is applied to contact 30 first traverses polysilicon layer 39 located between contact 30 and contact 32. If an increase in the ballast resistance of a semiconductor device is desired, the distance between contact 30 and contact 32 is increased. By increasing the distance between contact 30 and contact 32 in this manner, a larger quantity of polysilicon layer 39 is situated between contact 30 and contact 32. By situating a larger amount of polysilicon layer 39 between contact 30 and contact 32, a higher ballast resistance for the semiconductor device is realized. Furthermore, this increased ballast resistance can be maintained without increasing the base area of the semiconductor device. Thus, because the base area of the semiconductor device is not increased, an acceptable figure of merit can be realized, despite the increase in ballast resistance. In addition, the ballast effect (voltage drop) of this resistor is increased due to the increased current flow through this element.

Thus, current travels from emitter feeder metal 36, to contact 30. The current then flows from contact 30 to contact 32 through polysilicon layer 39. Current then flows from contact 32 to emitter 33 by again traversing polysilicon layer 39.

A semiconductor device can be manufactured in accordance with an exemplary embodiment of the present invention, in the following manner.

FIGS. 3–14 are cross sectional views illustrating a method for manufacturing the exemplary embodiment of the present invention illustrated in FIG. 2.

Figure 3:
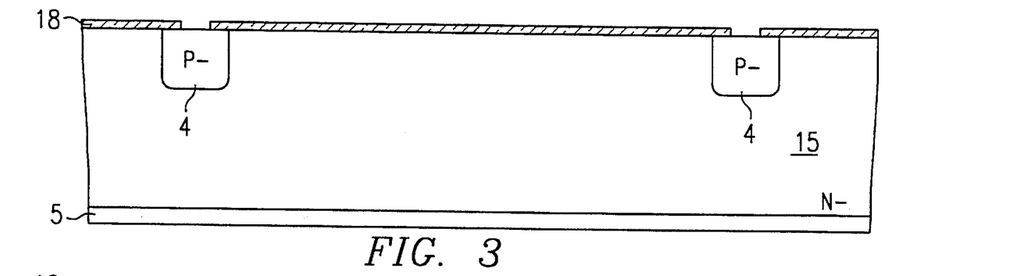
FIGS. 3–14 are side cross sectional views of a semiconductor device at various stages of manufacture in accordance with an exemplary embodiment of the present invention.

As shown in FIG. 3, the starting material is a semiconductor wafer, in this example, epitaxial layer 15 of doped n-type silicon having a resistivity of, for example, 2 ohm cm. Epitaxial layer 15 is located above substrate 5. A base diffusion layer 18 is formed on the top surface of epitaxial layer 15. This base diffusion layer may have a depth of about 0.6 microns. Other depths are possible and will be chosen by those skilled in the art in accordance with existing conditions. Furthermore, P− regions 4 are formed by the implantation of boron ions (dose $5 \times 10^{12}$ atoms/cm$^3$ energy 100 keV) followed by well known diffusion techniques.

Figure 4:
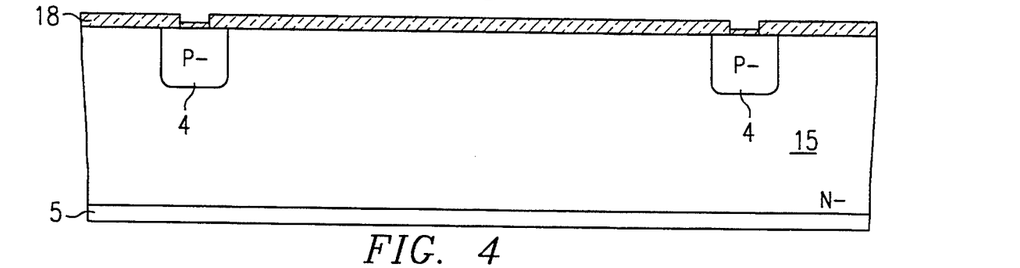

As shown in FIG. 4, the semiconductor device is subjected to a P− drive. This results in the growth of the previously deposited oxide layer, as well as the formation of oxide over the previously exposed portions of P− regions 4.

Figure 5:
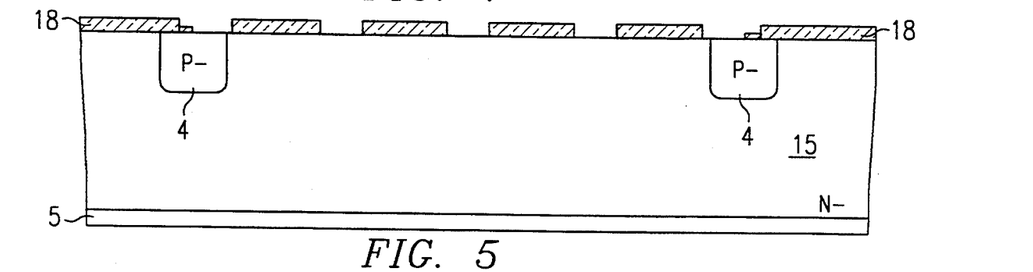

As shown in FIG. 5, portions of oxide layer 18 are removed to expose portions of P− regions 4 and epitaxial layer 15. The removal of portions of oxide layer 18 is accomplished using well known "mask and etch" technology.

Figure 6:
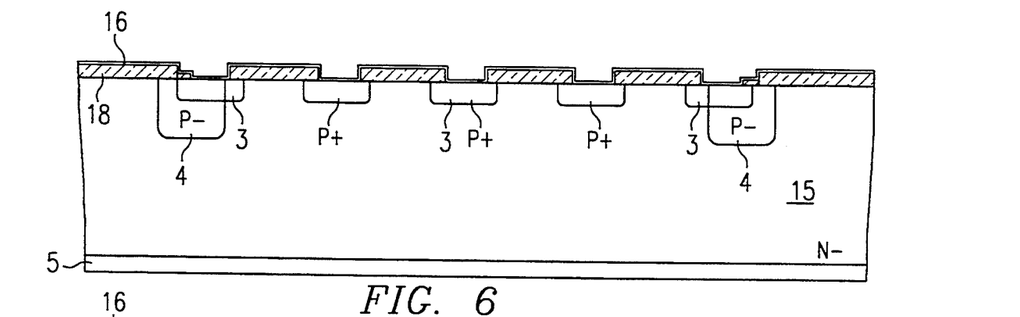

As shown in FIG. 6, the wafer is subjected to a P+ implant, such as $B^{11}$ ($5 \times 10^{15}$ atoms/cm$^3$ 25 keV) to form P+ regions 3. This may be followed by well known diffusion techniques. Oxide layer 15 is thus formed over the wafer.

Figure 7:
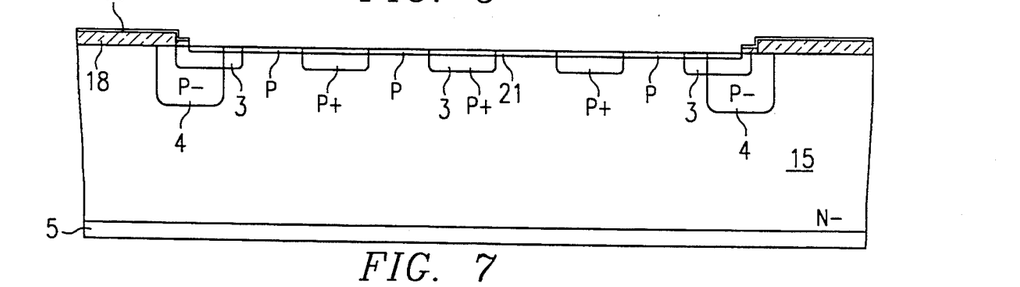

As shown in FIG. 7, a substantially large portion of layers 16 and 18 are removed. This is accomplished by using well known "mask and etch" technology. In addition, p type base region 21 is formed using either implantation (boron ions, dose 6E13, energy 25 keV) or diffusion.

Figure 8:
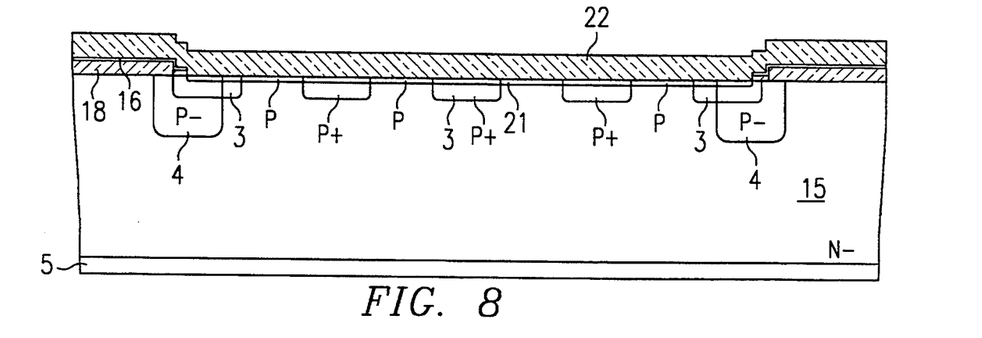
Figure 9:
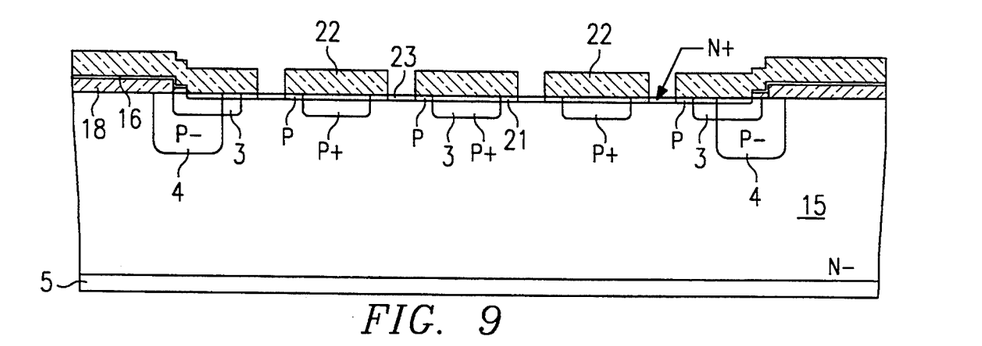

An oxide coating 22, as illustrated by FIG. 8, is then deposited onto the wafer. Portions of oxide coating 22 are removed using well known "mask and etch" technology (FIG. 9). The exposed wafer portions are then subjected to N+ implant (arsenic ions, dose $1 \times 10^{14}$ atoms/cm$^3$ energy 60 keV) to form emitter regions 23.

Figure 10:
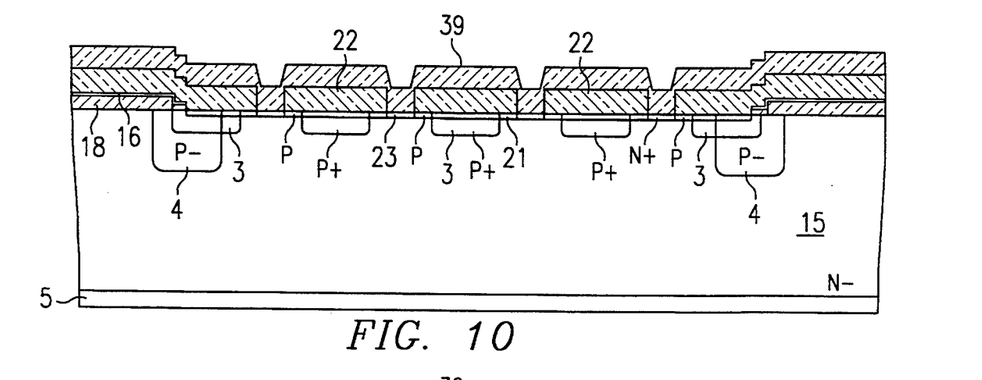
Figure 11:
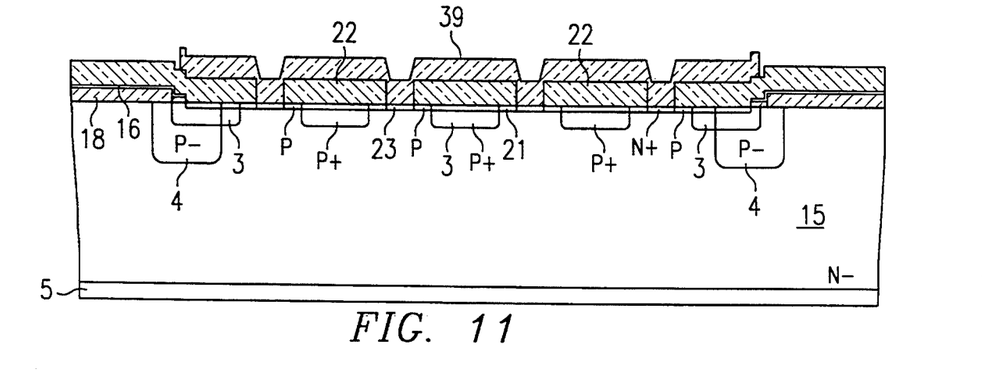
Figure 12:
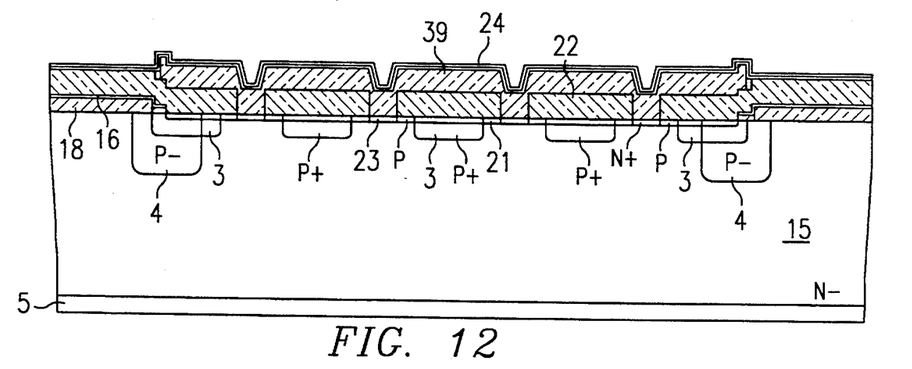
Figure 13:
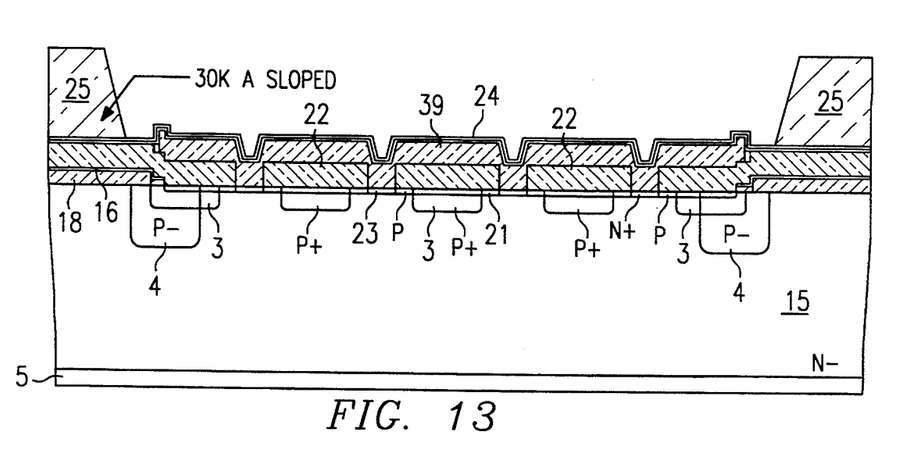

As shown in FIG. 10, the wafer is subjected to polysilicon deposition to form polysilicon layer 39. Then, as shown in FIG. 11, portions of polysilicon layer are removed. An insulation layer 24 is deposited onto the wafer (FIG. 12). Then, as shown in FIG. 13, a thick oxide layer 25 is deposited. Oxide layer 25 is used for capacitance reduction. Contacts 32 (contact regions Z) are then formed (using mask and etch technology) before metalization layer 26 is applied (FIG. 14).

Figure 14:
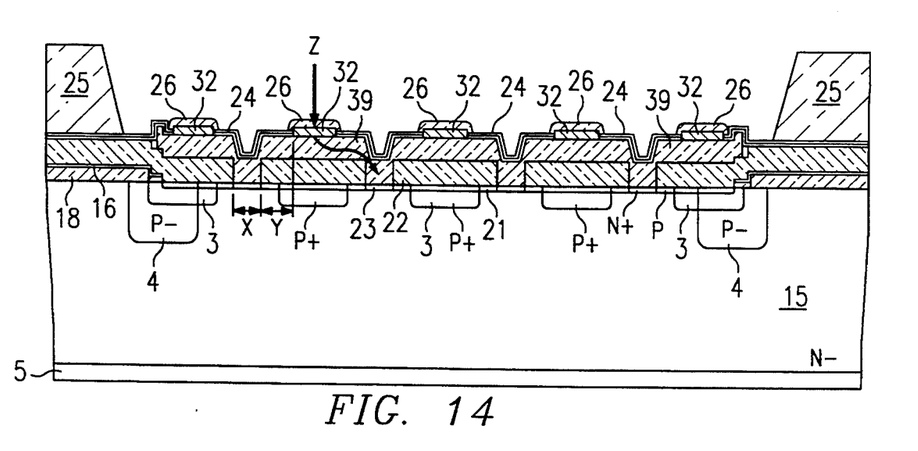
Figure 15:
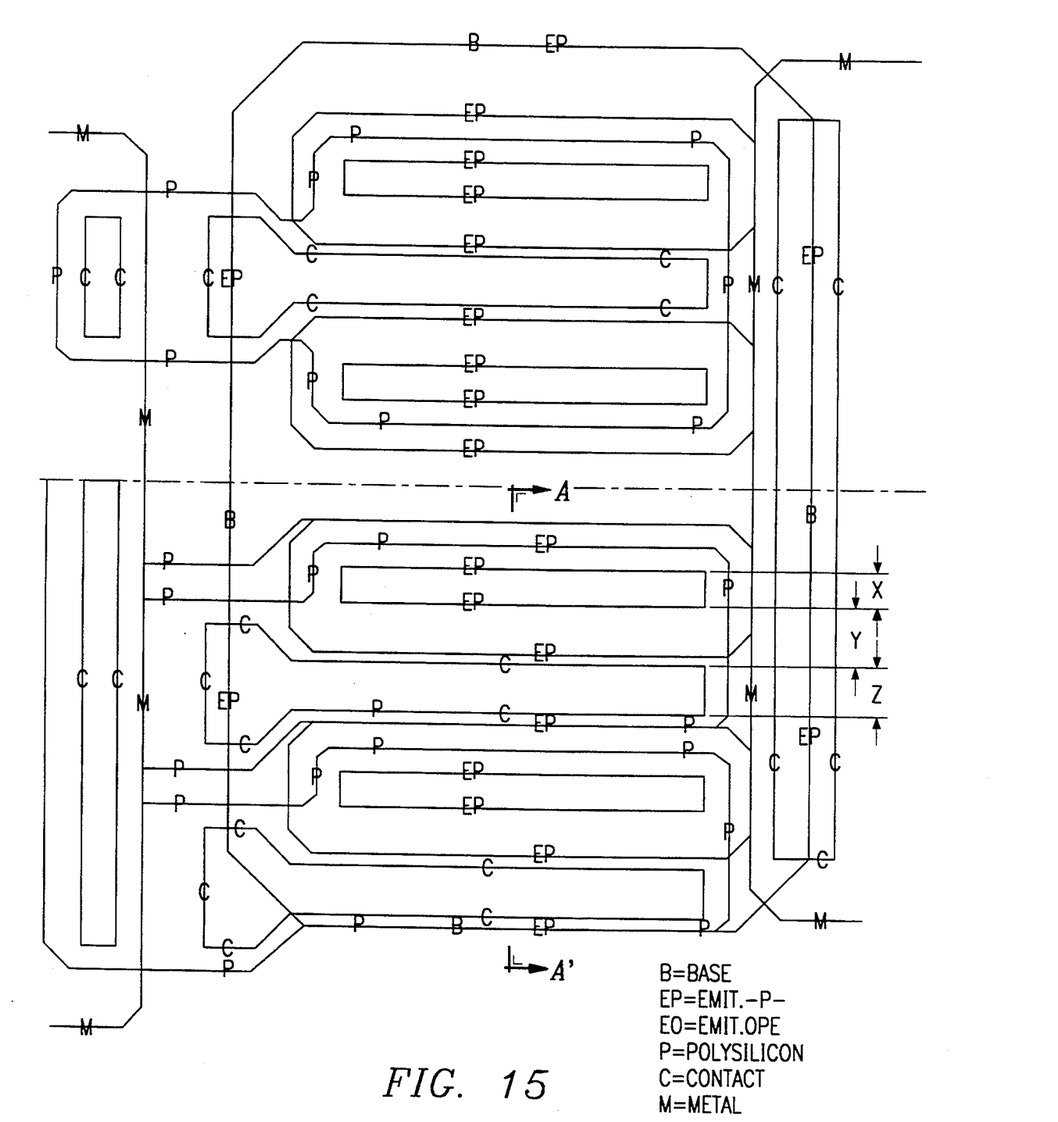
FIG. 15 is a top view of a semiconductor device at the stage of manufacture illustrated by FIG. 14. Two ballast schemes are illustrated.

A top view of the semiconductor device at the stage of manufacture corresponding to FIG. 14 is illustrated by FIG. 15. FIG. 15 illustrates two exemplary embodiments of the present invention, in which two ballast schemes (above and below the centerline) are shown. FIG. 14 is a cross sectional view of FIG. 15 taken in the plane A—A'. Corresponding letters in FIGS. 14 and 15 are used to refer to corresponding structures.

As shown in FIG. 14, current flows from contact region Z and then through polysilicon layer 39 until the current reaches emitter 23. As previously explained, the ballast resistance of a semiconductor device is increased by increasing the path length between contact region Z and emitter region 23. However, by increasing this path length, the width base diffusion layer 21 would also be increased. As previously described with reference to FIG. 1, by increasing the distance between contact 30 and contact 32, it is not necessary to increase the distance between contact 32 (contact region Z) and emitter region 23 in order to increase ballast resistance. Thus, the ballast resistance can be increased without adversely affecting the figure of merit of the semiconductor device.

Thus, it is possible to add virtually any level of ballasting without additional process complexity. In addition, it is also possible to allow any combination of site and emitter finger ballasting by the proper choice of the relative geometries and the resistivity of the materials used for the ballast medium. In the exemplary embodiment described above, polysilicon has been used. However, as is well known in the art, other mediums may be used, such as metals and diffused resistors.

Furthermore, it is possible to interchange the base and emitter feeders so that the emitters are outboard and the base feeders are inboard. This allows approximately one half of the p-plus drop existing in a standard overlay of a similar base area. This is extremely useful in overlay devices since the emitter injection and peripheral utilization injection is strongly impacted by this drop. This is because injection decreases exponentially with voltage drop.

While the invention has been described in terms of an exemplary embodiment, it is contemplated that it may be practiced as outlined above with modifications within the spirit and scope of the dependent claims.

What is claimed:

1. A semiconductor device, comprising:
   a substrate;
   a collector layer formed above said substrate;
   a base layer formed above said collector layer;
   a first contact region;
   a second contact region;
   a resistive medium connected between said first contact region and said second contact region;
   a plurality of emitter regions formed in said base layer in a non-interdigitated configuration; and
   a further resistive medium located above one of said plurality of emitter regions, said further resistive medium connected between said second contact region and said one of said plurality of emitter regions,
   wherein said section contact region is laterally offset relative to said one of said plurality of emitter region so that said further resistive medium creates a lateral ballasting effect.

2. The semiconductor device of claim 1, wherein ballast resistance of said semiconductor device is increased without decreasing the figure of merit of said device by increasing the distance between said first contact region and said second contact region.

3. The semiconductor device of claim 1, wherein said resistive medium includes polysilicon.

4. The semiconductor device according to claim 1, wherein said plurality of emitter regions are formed in a non-interdigitated configuration.

5. A semiconductor device, comprising:
   a substrate;
   a collector layer;
   a base layer formed above said collector layer;
   a first contact region;
   a second contact region;
   a resistive medium connected between said first contact region and said second contact region;
   an insulation layer;
   a plurality of active emitter regions formed in said base layer, each one of said plurality of active emitter regions formed in a respective opening in said insulation layer; and
   a further resistive medium located above one said plurality of emitter regions, said further resistive medium connected between said second contact region and said one of said plurality of active emitter regions,
   wherein said second contact region is laterally offset relative to said one of said plurality of emitter regions so that said further resistive medium creates a lateral ballasting effect.

6. The semiconductor device according to claim 5, wherein said plurality of emitter regions are formed in a non-interdigitated configuration.

7. The semiconductor device according to claim 5, wherein said further resistive medium is electrically insulated from said substrate.

8. The semiconductor device of claim 5, wherein ballast resistance of said semiconductor device is increased without decreasing the figure of merit of said device by increasing the distance between said first contact region and said second contact region.

* * * * *

UNITED STATES PATENT AND TRADEMARK OFFICE
CERTIFICATE OF CORRECTION

PATENT NO. : 5,444,292
DATED : August 22, 1995
INVENTOR(S) : William P. Imhauser It is certified that error appears in the above-indentified patent and that said Letters Patent is hereby corrected as shown below:

In column 5, claim 1, line 31, change "section" to --second--.

Signed and Sealed this

Twelfth Day of December, 1995

Attest:

BRUCE LEHMAN

Attesting Officer

Commissioner of Patents and Trademarks